US008086428B2

(12) United States Patent
Tanaka et al.

(10) Patent No.: US 8,086,428 B2
(45) Date of Patent: Dec. 27, 2011

(54) TIRE DESIGN METHOD

(75) Inventors: Yoshihiro Tanaka, Osaka (JP); Ken Ishihara, Osaka (JP)

(73) Assignee: Toyo Tire & Rubber Co., Ltd., Osaka (JP)

( * ) Notice: Subject to any disclaimer, the term of this patent is extended or adjusted under 35 U.S.C. 154(b) by 510 days.

(21) Appl. No.: 12/098,780

(22) Filed: Apr. 7, 2008

(65) Prior Publication Data

US 2008/0300840 A1 Dec. 4, 2008

(30) Foreign Application Priority Data

Apr. 13, 2007 (JP) .................... 2007-105913
Feb. 6, 2008 (JP) .................... 2008-026878

(51) Int. Cl.
G06F 7/60 (2006.01)
G06F 17/10 (2006.01)
G06F 19/00 (2011.01)
G06G 7/48 (2006.01)
(52) U.S. Cl. .................. 703/2; 703/7; 700/97
(58) Field of Classification Search .............. 703/2, 7; 700/97
See application file for complete search history.

(56) References Cited

U.S. PATENT DOCUMENTS

| 5,361,816 | A | * | 11/1994 | Hitzky | ...................... 152/209.22 |
| 5,710,718 | A | | 1/1998 | Kamegawa | |
| 6,083,268 | A | * | 7/2000 | Kelsey et al. | ...................... 703/7 |
| 6,230,112 | B1 | | 5/2001 | Ishiyama | |
| 6,430,993 | B1 | * | 8/2002 | Seta | ................ 73/146 |
| 6,531,012 | B2 | * | 3/2003 | Ishiyama | ................... 156/110.1 |
| 2001/0032694 | A1 | * | 10/2001 | Ishiyama | ................... 156/110.1 |
| 2002/0014294 | A1 | * | 2/2002 | Okano et al. | .................. 152/454 |
| 2002/0056496 | A1 | | 5/2002 | Tanaka et al. | |
| 2006/0096696 | A1 | | 5/2006 | Oku et al. | |
| 2008/0270084 | A1 | | 10/2008 | Ageishi | |

(Continued)

FOREIGN PATENT DOCUMENTS

JP   2002-15010   1/2002

(Continued)

OTHER PUBLICATIONS

J.R. Cho, K. W. Kim, W. S. Yoo, and S. I. Hong, "Mesh generation considering detailed tread blocks for reliable 3D tire analysis", Advances in Engineering Software 35 (2004).*

(Continued)

Primary Examiner — David Silver
Assistant Examiner — Angel J Calle
(74) Attorney, Agent, or Firm — Fish & Richardson P.C.

(57) ABSTRACT

An initial layout of one pitch unit of a tire tread pattern is decided. A finite element model of a tire is created by developing the one pitch unit of the initial layout into a plurality of pitches in the circumferential direction of the tire to carry out a structural analysis. Evaluation indices calculated through the analysis are integrated into one pitch unit for each element associated with the indices. The elements are classified according to the magnitudes of the integrated evaluation indices to determine a plurality of classes to which elements subject to removal belong, and elements to be removed are selected from each of classes thus determined. Elements to be added are selected from among the elements which have been removed to decide a layout of the current generation. A finite element model of a tire is created by developing the layout of the current generation into a plurality of pitches to carry out a structural analysis, and convergence of an objective function is determined.

7 Claims, 9 Drawing Sheets

U.S. PATENT DOCUMENTS

| | | |
|---|---|---|
| 2008/0300840 A1 | 12/2008 | Tanaka |
| 2008/0302465 A1 | 12/2008 | Ageishi |
| 2008/0302466 A1 | 12/2008 | Ageishi et al. |

FOREIGN PATENT DOCUMENTS

| | | |
|---|---|---|
| JP | 2002-149717 | 5/2002 |
| JP | 2003-16141 | 1/2003 |
| JP | 2003-150645 | 5/2003 |
| JP | 2005-008011 | 1/2005 |
| JP | 2005-65996 | 3/2005 |
| JP | 2005-100282 | 4/2005 |
| JP | 2006-111168 | 4/2006 |
| JP | 2006-199217 | 8/2006 |

OTHER PUBLICATIONS

Hiroshi Hasegawa and Keishi Kawamo, "A Method for the Shape and Topology Optimization of Mechanical Structures by Using Genetic Algorithm (Layout Optimization Method by Adoption of Removal and Addition parameters of Elements as Chromosomes)", 1995.*

Yong Kim, and Olivier de Weck, "Variable Chromosome Length Genetic Algorithm for Structural Topology Design Optimization", Apr. 2004.*

Wai-Ho Au, Keith C. C. Chan, and Andrew K. c. Wong, "A Fuzzy Approach to Partitioning Continuous Attributes for Classification", May 2006.*

Transactions of Japan Society of Mechanical Engineers (Series A), vol. 61(581):183-190 (Jan. 1995).

Transactions of Japan Society of Mechanical Engineers (Series A), vol. 63(605):170-177 (Jan. 1997).

Transactions of Japan Society of Mechanical Engineers (Series A), vol. 64(626):49-54 (Oct. 1998).

Camacho, G.T., et al., "Adaptive Lagrangian Modeling of Ballistic Penetration of Metallic Targets," Computer Methods in Applied Mechanics and Engineering (1997).

Final Office Action dated Mar. 3, 2011 mailed in corresponding U.S. Appl. No. 12/106,384.

Non-Final Office Action dated Mar. 17, 2011 mailed in corresponding U.S. Appl. No. 12/132,006.

Non-Final Office Action dated Mar. 30, 2011 mailed in corresponding U.S. Appl. No. 12/131,993.

Non-Final Office Action dated Sep. 30, 2010 mailed in corresponding U.S. Appl. No. 12/106,384.

Leiva and Watson "Automatic Generation of Basis Vectors for Shape Optimization in the *Genesis* Program," AIAA-98/4852 pp. 1-8 (1998).

Patel, H.D., "Shape Parameterization and Optimization Using the Boundary Shapes Concept" (2006).

Zhang, J. "Modified Thermal Load Approach For Automatic Generation of Basis Vectors in Shape Optimization," AIAA-94/4292-CP pp. 384-390 (1976).

Zhang, S. "Computer Aided Shape Optimization for Engineering Design with MSC/Nastran," The MacNeal-Schwendler Corp. pp. 1-20.

Japanese Office Action dated Apr. 14, 2011 mailed in corresponding Japanese Application No. 2007-152348 and English translation thereof.

Japanese Office Action dated Apr. 14, 2011 mailed in corresponding Japanese Application No. 2007-118714 and English translation thereof.

* cited by examiner

ELEMENT A

ELEMENT B

US 8,086,428 B2

TIRE DESIGN METHOD

CROSS-REFERENCE TO RELATED APPLICATIONS

This application is based upon and claims the benefit of priority from the prior Japanese Patent Applications No. 2007-105913, filed on Apr. 13, 2007 and No. 2008-26878, filed on Feb. 6, 2007; the entire contents of which are incorporated herein by reference.

BACKGROUND

The present invention relates to a tire design method, a program for the same, and a tire manufacturing method using the design method.

Since a tread pattern of a pneumatic tire has significant influence on the hydroplaning performance, braking performance, and noises, there are demands for designs of tire tread patterns having optimized topology and shapes.

When a tire tread pattern is designed, a design plan satisfying performance requirements is made based on knowledge of the related art, experiences, and limitations on designing. One approach for verification of the design is to check whether the performance requirements are satisfied or not using a structural analysis. When it is revealed at this stage that the performance requirements are not satisfied, the design is corrected, and a structural analysis is conducted again to verify the design. This process is repeated until the performance requirements are satisfied, and a design plan is thereby finalized.

According to the design method in the related art, no guarantee is given on whether a design plan finalized within a range set based on design limitations provides optimal values or not. Since the method involves the process of repeating designing, structural analysis, and re-designing, a design task will require an enormous amount of time.

In general, a genetic algorithm is frequently used for the numerical optimization to optimize the design of a tire tread pattern (for example, see U.S. Pat. No. 6,531,012 B2). However, there are a great number of individual genes in the case of pattern designing of a wide area. Then, the computational cost is increased, and the approach is not effective enough to be used for practical design tasks.

Layout optimization techniques employing the finite element method includes the ECAT (Evolutional Clustering Algorithm for Topological Optimization). According to the ECAT, a structure of interest is regarded as an individual body, and elements are classified according to the magnitudes of their evaluation indices which are determined according to the problem to be solved. A global distribution of the evaluation indices in the structure is obtained, and actions of removing or adding each class of elements having small evaluation indices one after another are regarded as behaviors. Then, a layout is decided through evolution of such behaviors. Although the ECAT has been used for layout optimization problems in mechanical structures such as cantilevers, no application of this method to a tire tread pattern has been known.

SUMMARY

It is an object of the invention to provide a tire design method in which the ECAT is used for designing a tire tread pattern to allow efficient designing and to allow the performance of a tire to be significantly improved.

A tire design method according to an embodiment of the invention includes the steps of:

(a) deciding an initial layout of one pitch unit of a tire tread pattern;

(b) creating a finite element model of a tire in which the one pitch unit of the initial layout are developed in plural in the circumferential direction of the tire;

(c) calculating an evaluation index for each element through a structural analysis using the finite element model of the initial layout;

(d) integrating calculated evaluation indices into one pitch unit for each element associated with the indices, classifying the elements according to the magnitudes of the integrated evaluation indices to determine a plurality of classes to which elements subject to removal belong, and selecting elements to be removed from each of classes thus determined;

(e) selecting elements to be added from among the elements which have been removed;

(f) obtaining a layout of the current generation through the removal and addition of elements at the steps (d) and (e) to create a finite element model of a tire in which one pitch unit of the layout are developed in plural in the circumferential direction of the tire;

(g) calculating an evaluation index for each element through a structural analysis using the finite element model of the layout of the current generation; and (h) determining convergence of an objective function from the calculated evaluation indices, updating the layout to the layout of the current generation and returning to the step (d) when it is determined that convergence has not occurred, and deciding a tire tread pattern using the layout of the current generation as an optimum when it is determined that convergence has occurred.

In an embodiment of the invention, a program for designing a tire using a computer is provided, and the program causes the computer to execute the above-described steps. In an embodiment of the invention, a tire manufacturing method characterized in that a tire is designed and manufactured using the above-described design method is further provided.

DETAILED DESCRIPTION

In an embodiment of the invention, the ECAT is used to optimize a design of a tire tread pattern (or to optimize a layout of the same). Specifically, elements of a finite element model of the tire tread pattern are classified according to the magnitudes of evaluation indices calculated for the model. A global distribution of the evaluation indices in the layout is obtained, and a final layout is decided through evolution of behaviors which are actions of removing or adding (restoring) elements. Since optimization is carried out by obtaining a global distribution of evaluation indices as thus described, a global optimum can be obtained instead of localized solutions, and the performance of the tire can therefore be improved. The embodiment results in lighter computational loads than using a genetic algorithm according to the related art. Therefore, a tire tread pattern can be efficiently designed.

In a structural analysis using a finite element model according to the embodiment of the invention, one pitch unit of a layout is developed into a plurality of pitches in the circumferential direction of a tire to calculate evaluation indices. An objective function is obtained from the evaluation indices of the plurality of pitches, and convergence of the function is evaluated. On the contrary, in a process of removing and adding elements, a value obtained by integrating the indices to represent one pitch unit is used. In general, a tire tread pattern is configured by disposing features in one-pitch unit periodically in the circumferential direction of the tire to form tread features. Therefore, the tread pattern can be optimized in a more practical manner by evaluating it using evaluation indices and an objective function for a plurality of pitches. Since the process of removing and adding elements uses a value representing one pitch unit obtained by integrating those indices, it is possible to avoid the problem of variation in designs of features between pitches.

An embodiment of the invention will now be described with reference to the drawings.

Figure 1:
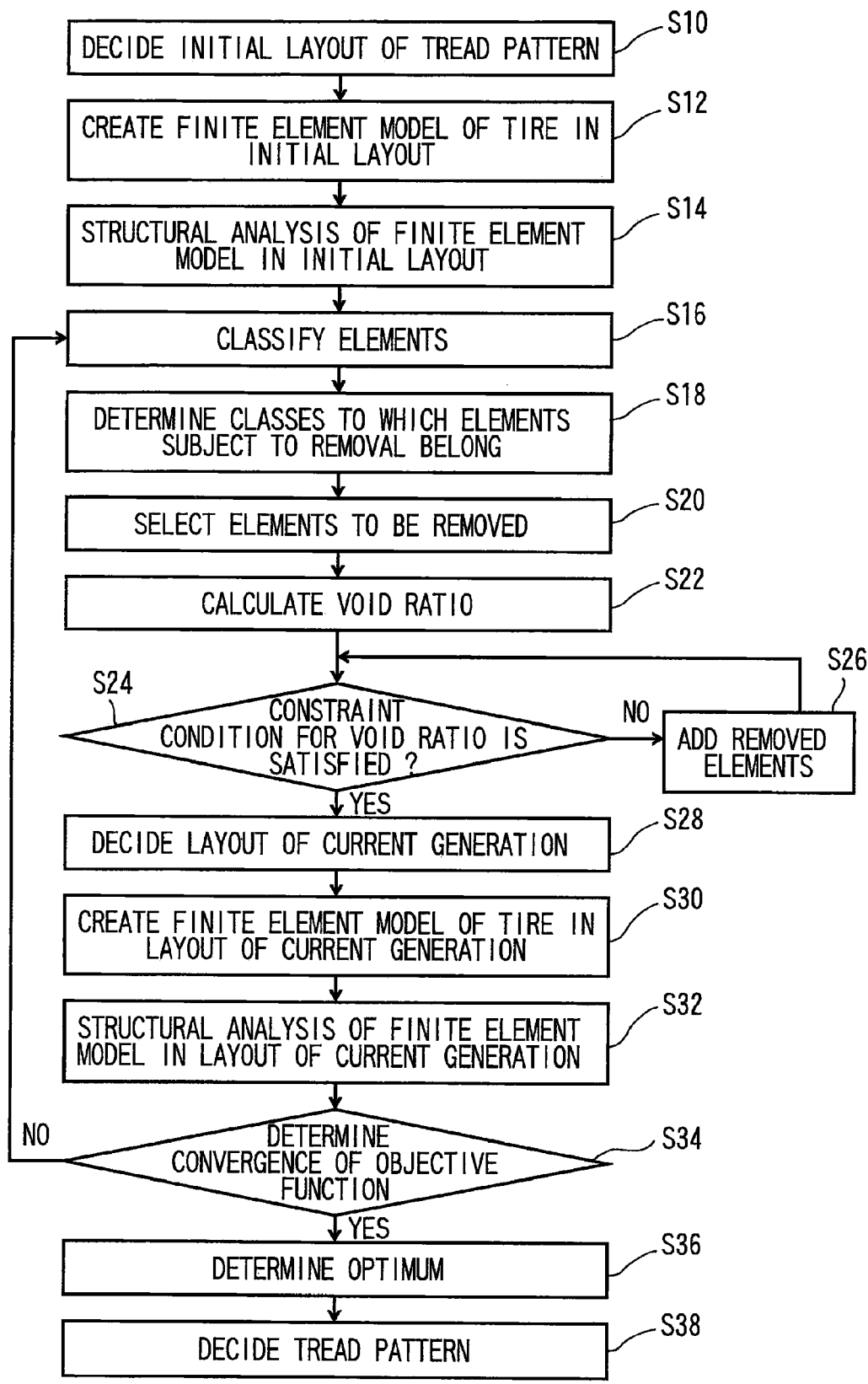
FIG. 1 is a flow chart showing a flow of processes of a tire design method according to a first embodiment of the invention.

FIG. 1 is a flow chart showing a flow of processes of a tire design method according to a first embodiment. In the present embodiment, the topology and shape of a tread pattern of a pneumatic tire is optimized using the ECAT, and the embodiment may be implemented using a computer. Reference may be made to Documents 1 to 3 cited below for description on the ECAT.

Document 1: Hiroshi Hasegawa and Keishi Kawamo, "A Method for the Shape and Topology Optimization of Mechanical Structures by Using Genetic Algorithm (Layout Optimization Method by Adoption of Removal and Addition Parameters of Elements as Chromosomes)", Transactions of Japan Society of Mechanical Engineers (Series A), Vol. 61, No. 581, (1995-1), pp. 183-190

Document 2: Yasushi Tsuruta, Hiroshi Hasegawa and Keishi Kawamo, "A Method for Shape and Topology Optimization of Mechanical Structures by Using Genetic Algorithm (2nd Report, on Convergence of Solutions of Our Method by Adoption of Removal and Addition Parameters of Finite Elements as Chromosomes)", Transactions of Japan Society of Mechanical Engineers (Series A), Vol. 63, No. 605 (1997-1), pp. 170-177

Document 3: Yusaku Suzuki, Hiroshi Hasegawa and Keishi Kawamo, "A Method for Shape and Topology Optimization of Mechanical Structures by Using Genetic Algorithm (3rd Report, A Deterministic Approach with a Single Individual by Using Removal and Addition Parameters", Transactions of Japan Society of Mechanical Engineers (Series A), Vol. 64, No. 626 (1998-10), pp. 49-54

More specifically, the design method of the present embodiment can be carried out by creating a program for causing a computer to execute steps as described below and by using a computer such as a personal computer having such a program stored (installed) in a hard disk and the like thereof. The program stored in the hard disk is read into a RAM as occasion demands to execute the same. Calculations are carried out by a CPU using various data input from an input unit such as a keyboard, and calculation results are displayed by a display unit such as a monitor. Such a program may be stored in various types of computer-readable recording media such as CD-ROMs, DVDs, MDs, and MO disks. Therefore, a drive for such a recording medium may be provided in a computer, and the program may be executed using the drive.

According to the design method of the present embodiment, an initial layout of one pitch unit of a tire tread pattern and an objective function associated with the performance of the tire are first decided at step S10. The initial layout may be decided without any particular limitation to provide, for example, a tread having no groove at all, a tread having only main grooves extending in the circumferential direction thereof, a tread having main grooves and lateral grooves extending in a direction across the main grooves, or a tread having blocks defined by main grooves and lateral grooves. In the present embodiment, the initial layout of the tread pattern has only main grooves which are grooves extending in the circumferential direction of the tread. Therefore, the initial layout of the present embodiment is determined by the width of the tread pattern, the length of one pitch unit, the position of the main grooves in the direction of the width of the tire, and the width of the main grooves.

The objective function may be a physical quantity whose value changes depending on the tire tread pattern. Specifically, the function may be ground contact pressure distribution of the tire at the time of braking and acceleration, an average ground contact pressure of the tire, stress, strain, strain energy, frictional energy, sliding velocity on road surfaces, or displacement of the tire. For example, the ground contact pressure distribution of the tire is chosen as the objective function, and an optimization problem for minimizing the function is defined.

Figure 2:
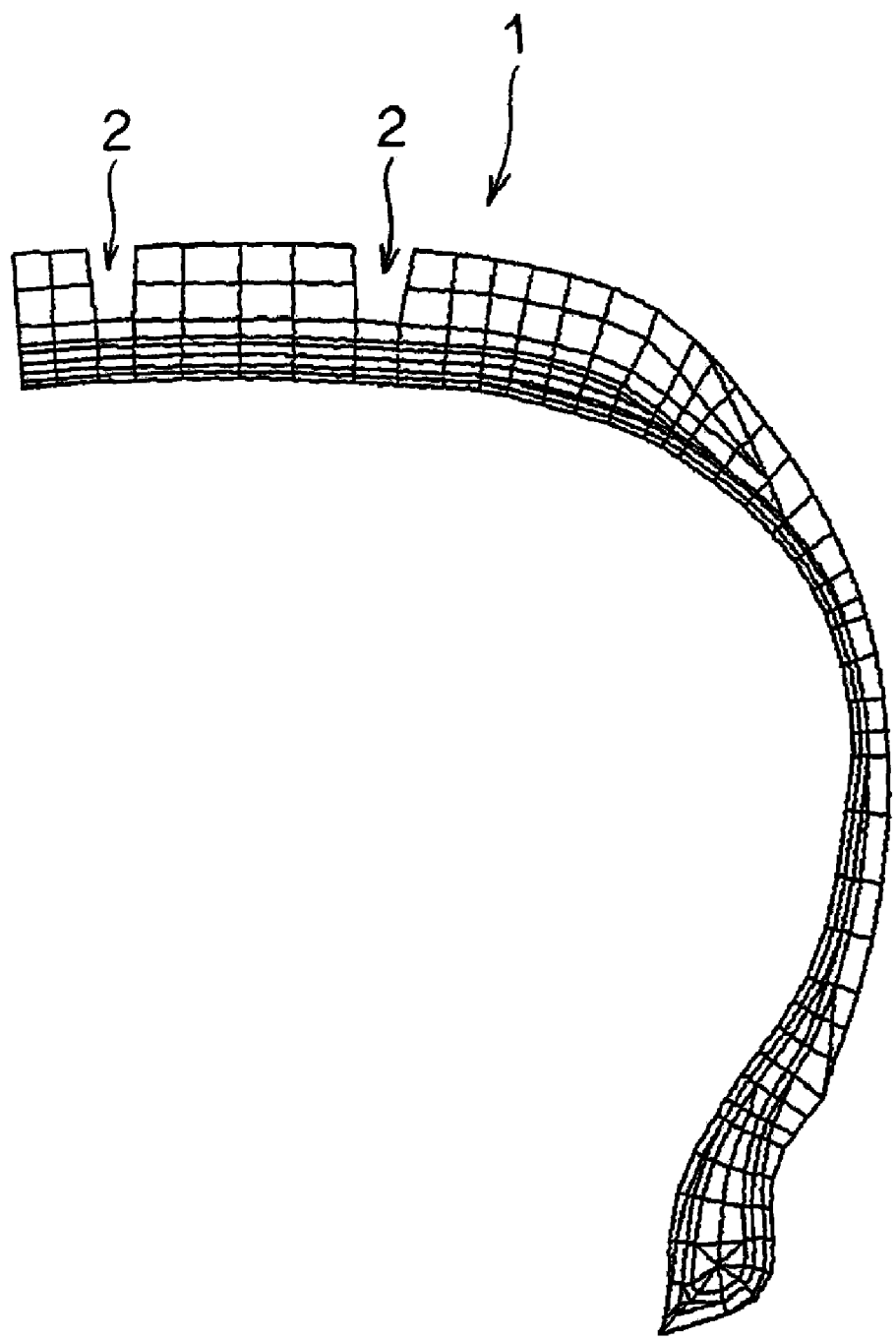
FIG. 2 is a half sectional view of a tire representing an example of a finite element model of a tire.

At step S12, a finite element model (hereinafter referred to as "FEM model") of the tire having the initial layout is created. An FEM model is a model of a tire created by dividing the tire including internal structures thereof into elements in the form of a mesh such that a physical quantity as described above for evaluating tire performance can be numerically and analytically obtained through a structural analysis. In this embodiment, as shown in FIG. 2, a tire FEM model comprising a tread pattern having only main grooves 2 on a surface of a tread 1 is created.

Referring to the creation of such an FEM model, one pitch unit of the initial layout is developed into a plurality of pitches in the circumferential direction of the tire to create an FEM model representing the entire circumference of the tire. In this example, since the initial layout is a tread pattern having main grooves only, what is required is only to sweep the two-dimensional FEM model shown in FIG. 2 throughout the circumference of the tire. However, since what is shown in FIG. 2 is a half sectional view of the model, the entire width of the model is swept in practice. At this time, the initial layout is developed in the circumferential direction at equal intervals or unequal intervals depending on the purpose. Through the above-described sweeping, the FEM model of the tire where the initial layout is developed into a plurality of pitches is created as a three-dimensional FEM model.

At the next step S14, a structural analysis is carried out using the tire FEM model having the initial layout obtained as described above. The structural analysis involves calculations performed on the FEM model with analysis conditions applied, including the internal pressure and load of the tire, the coefficient of friction with road surface, and physical properties of the rubber material of which the tread pattern is made. Thus, an evaluation index is calculated for each element of a ground contact surface of the tire tread pattern. Such a structural analysis can be executed by creating a dedicated program using a generalized programming language (e.g., FORTRAN). Alternatively, an FEM analysis program available on the market may be used. Such programs available on the market include "ABAQUS" manufactured by ABAQUS Inc. and "MARC" manufactured by MSC Software Corporation.

The evaluation index is a physical quantity which is calculated for each element of the ground contact surface and which serves as a basis for the calculation of the objective function. For example, the evaluation index may be stress, strain, strain energy, ground contact pressure, ground contact pressure distribution, frictional energy, sliding velocity on road surfaces, or displacement and so on.

At the next step S16, evaluation indices calculated as described above are integrated to represent one pitch unit of each element associated therewith, and the elements are classified according to the magnitudes of the evaluation indices thus integrated.

Figure 3:
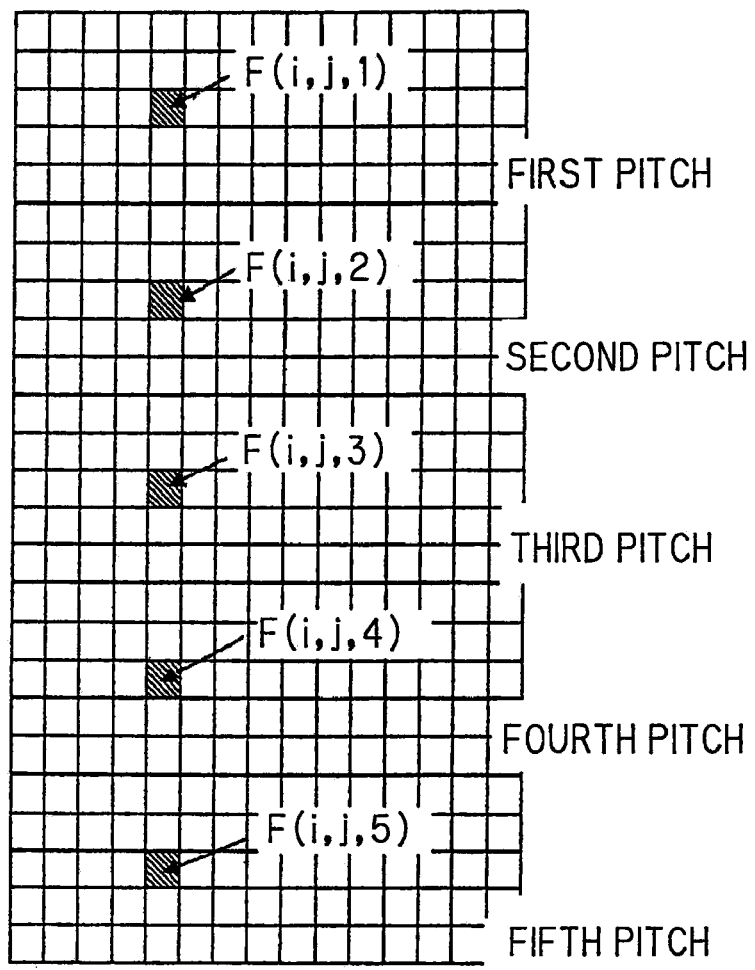
FIG. 3 shows a position for evaluating a function of an evaluation index of an arbitrary element in an example wherein a layout is developed into five pitches, such a position being shown for each pitch.

A method of integrating evaluation indices to represent one pitch unit will now be described with reference to FIGS. 3 and 4. When five pitches are periodically disposed as shown in FIG. 3, functions of the evaluation indices of elements respectively associated with the pitches are expressed as follows.

First Pitch: F (i, j, 1)
Second Pitch: F (i, j, 2)
Third Pitch: F (i, j, 3)
Fourth Pitch: F (i, j, 4)
Fifth Pitch: F (i, j, 5)

Figure 4:
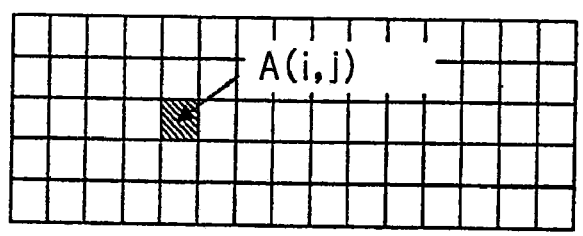
FIG. 4 shows a position for evaluating a function of an evaluation index of an arbitrary element obtained by integrating functions of evaluation indices for various pitches to represent one pitch unit.

Therefore, when those evaluation indices are integrated to represent one pitch unit as shown in FIG. 4, the evaluation index of an arbitrary element in the layout in the one pitch unit or a function A (i, j) of an integrated evaluation index is expressed by Equation (1) shown below.

$$A(i, j) = \frac{\sum_{k=1}^{N} F(i, j, k)}{N} \quad (1)$$

where N represents the number of pitches.

When the indices are integrated to represent one pitch unit, an average value may be obtained as shown. Alternatively, a total value may be simply obtained.

Elements included in the layout of one pitch unit are classified based on an evaluation index thus integrated. Specifically, the classification is carried out by categorizing the magnitude of the evaluation index into a plurality of levels. For example, the difference between a minimum value and a maximum value of the evaluation index is divided into ten equal parts to set ten levels, and all elements are allocated to respective levels associated therewith and are thereby categorized into ten classes. The classes may be set at equal intervals as thus described and may alternatively be set at unequal intervals.

At the next step S18, classes to which elements subject to removal belong are determined. Such determination of classes subject to removal is carried out according to the level of magnitude of the evaluation index of each class.

Specifically, when elements having great evaluation indices are subject to removal just as in the case where the evaluation index is distribution of a ground contact pressure (i.e., a square of a difference between an average ground contact pressure and a ground contact pressure of an element of interest), a plurality of classes having evaluation indices on the greater side are determined as classes subject to removal. On the contrary, when elements having small evaluation indices are subject to removal (for example, when a pattern for increasing deflection of a tread portion is to be designed, elements having small displacements are removed), a plurality of classes having evaluation indices on the smaller side are determined as classes subject to removal. More specifically, classes subject to removal can be determined based on Equation (2) shown below.

$$N_{c\beta} = \beta N_{c\mu} \quad (2)$$

where $N_{c\beta}$ represents an upper limit for class numbers to which elements subject to removal belong; $N_{c\mu}$ represents class numbers to which elements having an average evaluation index value belong; and $\beta$ represents a removal factor. Elements belonging to classes having class numbers equal to and smaller than the value $N_{c\beta}$ given by Equation (2) are subject to removal. Referring to class numbers, when elements having great evaluation indices are subject to removal, the class numbers are assigned starting with the smallest number to elements having great evaluation indices in decreasing order of the magnitude of the index values. When elements having small evaluation indices are subject to removal, the class numbers are assigned starting with the smallest number to elements having small evaluation indices in increasing order of the magnitude of index values. The removal factor $\beta$ may have a predetermined value. Alternatively, as described in Document 1 it may be obtained along with an $\alpha$-cut value and an addition factor $\gamma$ by performing an optimization calculation such as a genetic algorithm for coding such parameters in chromosomes as genes. The addition factor $\gamma$ is a factor defined by Equation (3) shown below as described in Document 1.

$$N_{p\gamma} = \gamma N_{ps} \quad (3)$$

where $N_{p\gamma}$ represents the number of elements added, and $N_{ps}$ represents the cumulative number of elements removed. At steps S21 to S26 which will be described later, instead of determining elements to be added based on a void ratio, a history of removal may be stored for elements which have been removed in the order of the occurrence of removal, and all of elements in places in the order of removal corresponding to values equal to or greater than the value $N_{p\gamma}$ given by Equation (3) may be added.

At the next step S20, elements to be removed are selected from each of the classes subject to removal determined at step S18, and the selected elements are removed from the layout. Elements to be removed are preferably extracted from the classes subject to removal in a fuzzy manner. In order to perform such fuzzy extraction, fuzzy partitioning is carried out by creating a membership function using the fuzzy c-means method as described in Document 1. The membership function partitions elements in a class subject to removal into elements which are subject to removal and elements which are not subject to removal using an α-cut value. Elements to be removed are selected by obtaining the α-cut value α.

As thus described, according to the ECAT, a plurality of classes are determined as classes subject to removal, and elements to be removed are selected from each of the classes subject to removal using fuzzy partitioning. Therefore, when elements having great evaluation indices are subject to removal, this approach is more preferable than simply removing all elements starting with the class having the greatest evaluation index, in that an optimum can be obtained while avoiding localized solutions.

After elements are removed as thus described, elements to be restored (or added) are determined from among the elements which have been removed based on a limiting condition on the void ratio of the tread pattern. Specifically, the void ratio of the layout after the removal of the elements is first calculated at step S22. The void ratio is the ratio of the area of the groove portions (portions having no contact with the ground) to the entire area of the tread pattern in one pitch unit. Normally, an upper limit for the void ratio is set in the range from 0.25 to 0.45 as the constraint condition.

Next, it is determined at step S24 whether the calculated void ratio satisfies the constraint condition or not. When the constraint condition is not satisfied or when the calculated void ratio is in the excess of the upper limit for the void ratio that is set in advance, the elements which have been removed are added at step S26 to compensate for the shortage of elements. That is, the required number of elements is add among the elements to be removed selected at step S20 such that the constraint condition on the void ratio is satisfied. Since the evaluation indices for the elements removed at step S20 are stored, elements are added in the order of their probabilities of being left on the layout. Specifically, when elements having great evaluation indices are subject to removal, elements are added in increasing order of the magnitude of evaluation indices. When elements having small evaluation indices are subject to removal, elements are added in decreasing order of the magnitude of evaluation indices.

When it is determined at step S24 that the constraint condition is satisfied, the process proceeds to step S28 to finalize a layout of the current generation obtained by removing and adding elements at the above-described steps.

Then, a tire FEM model having the layout of the current generation is created at step S30. At this time, an FEM model is created to represent the entire circumference of a tire by developing one pitch unit of the current generation layout into a plurality of pitches in the circumferential direction of the tire. A method of developing a pattern of one pitch unit of the current-generation layout will now be described with reference to FIGS. 5 and 6.

Figure 5:
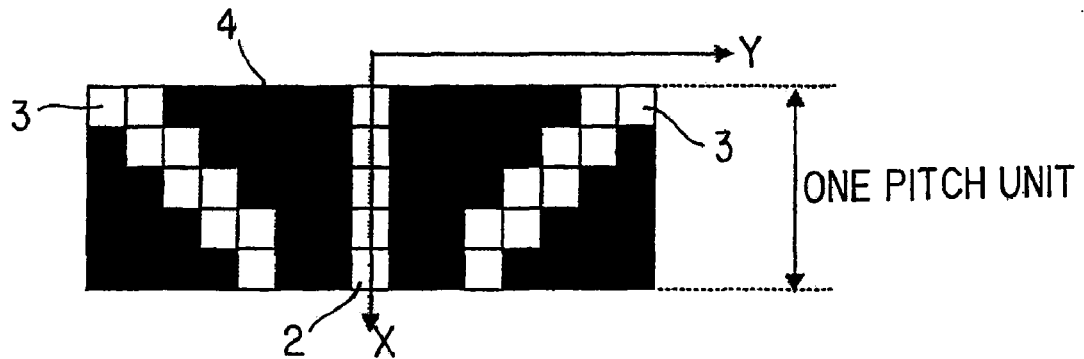
FIG. 5 shows an example of features in one pitch unit of a tread pattern.
Figure 6:
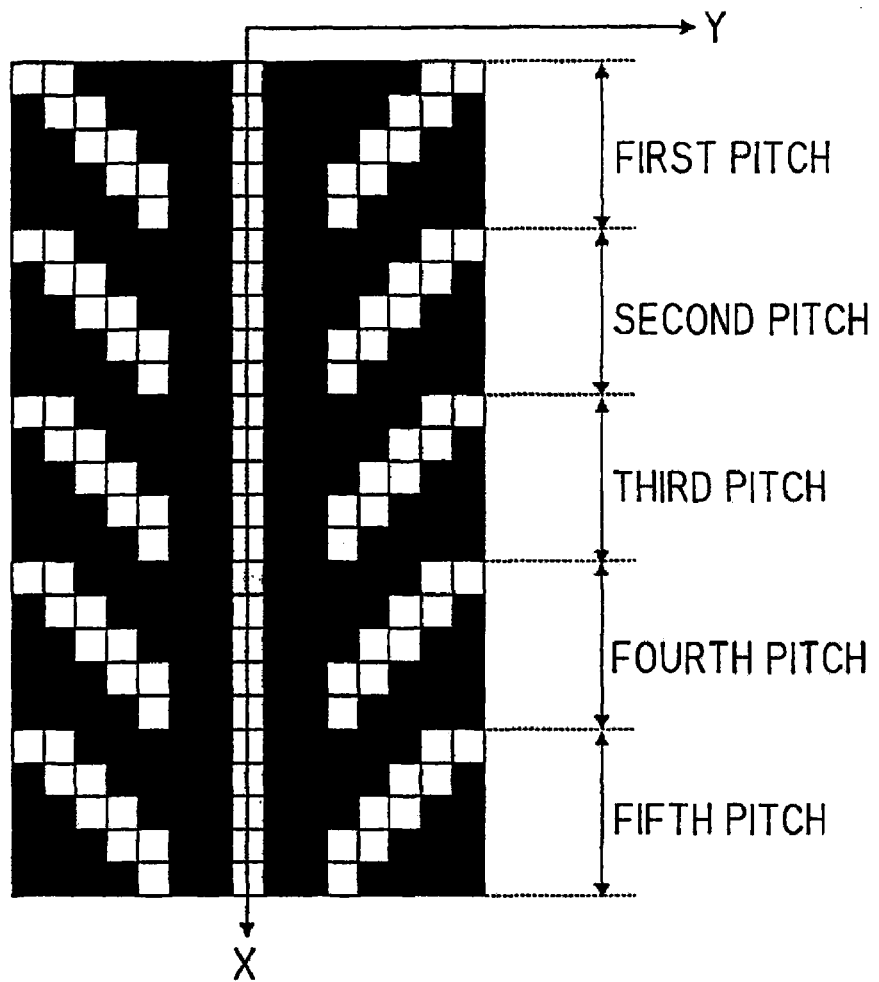
FIG. 6 shows an example in which the features in the one pitch unit are developed into five pitches.

FIG. 5 shows a pattern of one pitch unit of a tire tread pattern extending the entire width of the tread. Reference numeral 2 represents a main groove (a groove in the circumferential direction). Reference numeral 3 represents lateral grooves. The black regions indicated by reference numeral 4 represent land portions. X represents the circumferential direction of the tire, and Y represents the width direction of the tire. The pattern of one pitch unit is periodically disposed in a predetermined number of pitches in the circumferential direction X of the tire as shown in FIG. 6. In the example shown in FIG. 6, the pattern is periodically disposed to define five pitches, i.e., first to fifth pitches.

Next, at step S32, the FEM model of the current generation layout thus obtained is used to execute a structural analysis similar to that at step S14 described above, and an evaluation index is calculated for each element on the ground contact surface of the tire tread pattern.

At step S34, the convergence of an objective function is determined. The objective function is calculated from the evaluation indices obtained through the structural analysis. For example, when the objective function is distribution of the ground contact pressure of the tire, it is calculated from the distribution of the ground contact pressure at each element which is an evaluation index.

For example, convergence is determined based on whether the difference between the value of the objective function for the layout of the preceding generation and the value of the objective function for the layout of the current generation is smaller than a predetermined value or not. Alternatively, the determination may be made based on whether the value of the objective function for the layout of the current generation has exceeded or fallen below the value of the objective function for the initial layout by a predetermined amount or more.

When such determination indicates that the objective function has not converged yet, the layout is updated to the layout of the current generation, and the process returns to step S16. That is, elements are classified at step S16 using the layout of the current generation as an initial value, and the process then proceeds to step S18 and so on. Thus, steps S16 to S34 are repeated until the objective function is converged.

When it is determined at step S34 that the objective function has converged, the layout of the current generation at that time is determined to be a numerical solution (step S36), and a tread pattern is decided based on the numerical solution (step S38).

Vulcanization molding can be carried out according to a normal method to manufacture a pneumatic tire in practice from a design of a tire having such a tread pattern. It is therefore possible to provide a pneumatic tire which is improved in tire performance associated with an objective function as described above.

According to the present embodiment, since the ECAT is used to optimize the design of a tire tread pattern, a global optimum can be obtained instead of reaching localized solutions, whereby a tire can be provided with improved performance. Since the approach results in smaller computational loads when compared to the use of a genetic algorithm according to the related art, a tire tread pattern can be more efficiently designed.

According to the present embodiment, a structural analysis and determination of an objective function is carried out using an FEM model obtained by developing a layout of one pitch unit into a plurality of pitches, whereas a process of removing and adding elements according to the ECAT is carried out using a value obtained by integrating values for those pitches to represent one pitch unit. Therefore, the design of a tire tread pattern can be optimized in a more practical manner, and it is possible to avoid the problem of variation of a design of a feature between pitches.

Figure 7:
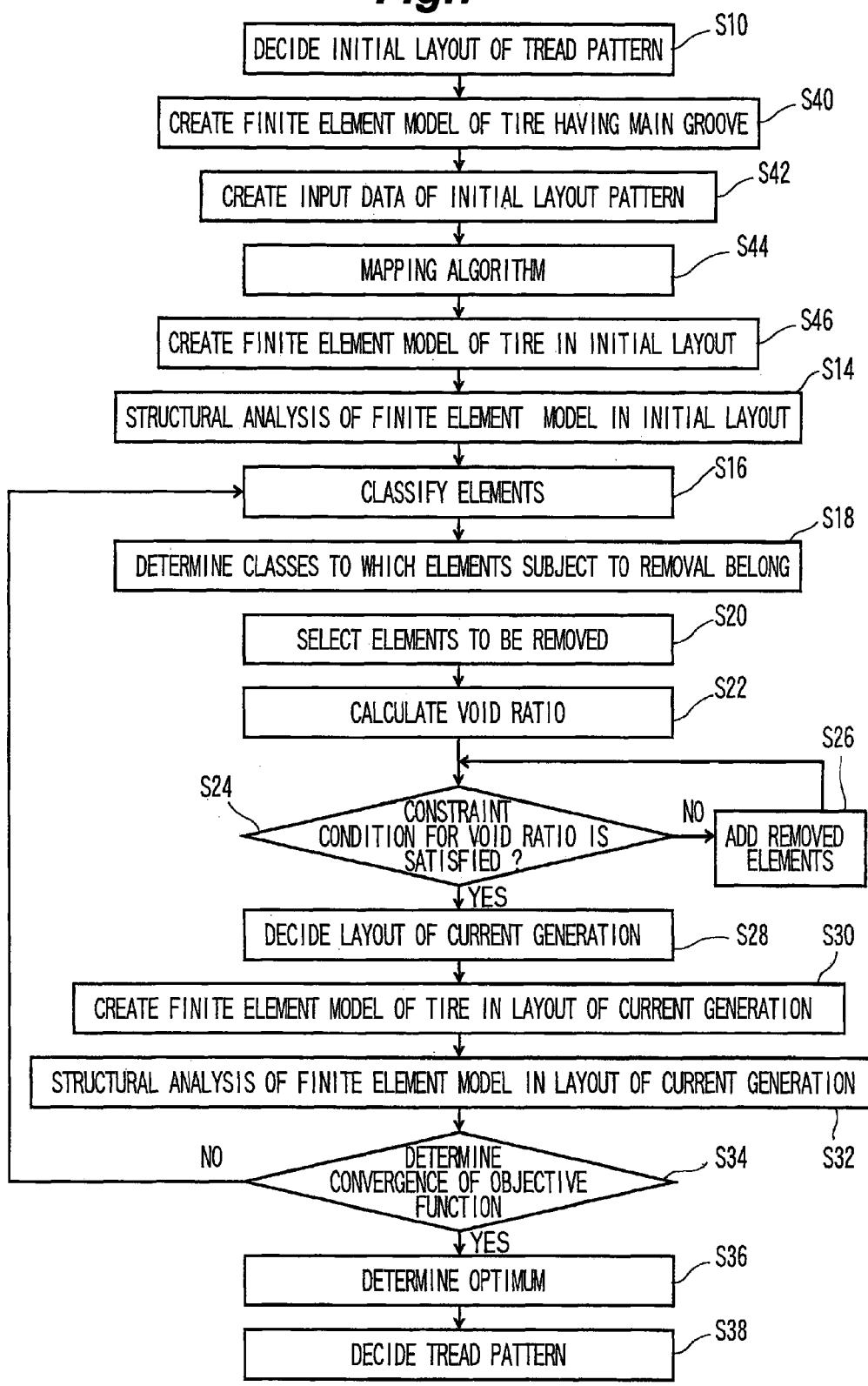
FIG. 7 is a flow chart showing a flow of processes of a tire design method according to a second embodiment of the invention.

FIG. 7 is a flow chart showing a flow of processes of a tire design method according to a second embodiment.

In this embodiment, a tire tread pattern has a circumferential groove and lateral grooves in its initial layout. When a tire tread pattern is designed, the pattern designing is limited to some extent. For example, a general specification may be made for the design of the tread pattern such that the pattern will have a main groove 2 and lateral grooves 3 as shown in FIG. 5. In this case, optimization is carried out using the specified tread pattern as an initial layout.

In the present embodiment, the tread pattern specified as described above is used as an initial layout. In order to execute a structural analysis of a tire FEM model having the initial layout, the tire FEM model having the initial layout is automatically generated from an FEM model of a tire having a main groove only. Specifically, the following steps are taken.

After the initial layout is decided at step S10, at step S40, an FEM model of a tire having a main groove only is created in the same manner as step 12 in the first embodiment. Specifically, a two-dimensional FEM model as shown in FIG. 2 is swept to define the entire circumference of a tire, whereby a three-dimensional FEM model is created.

Next, at step S42, input data associated with a tread pattern having the above-described initial layout are created. Specifically, coordinate data of figures representing tread pattern specified as described above are created and input.

At step S44, in order to created an FEM model of a tire having a tire tread pattern in the initial layout specified as described above from the FEM model of a tire having a main groove only, a mapping algorithm is carried out using the input data. The mapping algorithm is carried out on features in one pitch unit of the tread pattern.

Figure 8:
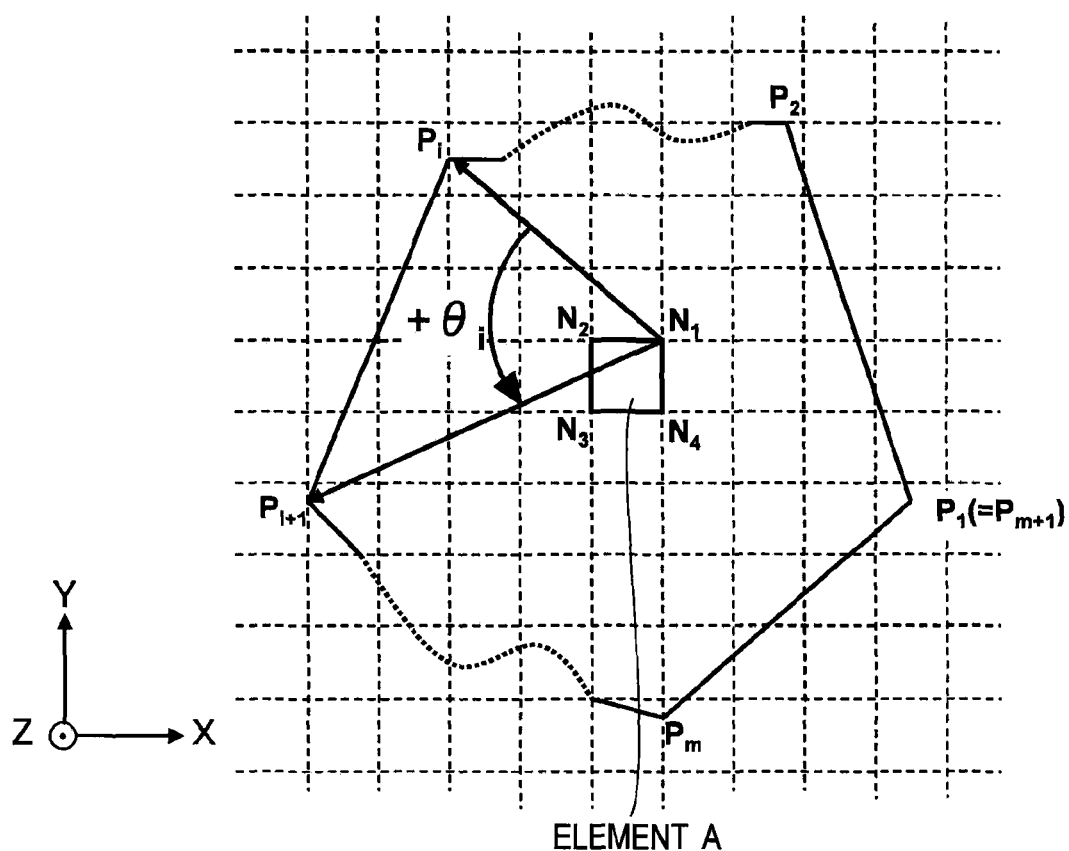
FIG. 8 is a diagram showing a relationship between a closed figure of an initial layout and a finite element model in a mapping process.

Process performed according to the mapping algorithm will now be described. FIG. 8 shows a relationship between a closed figure (m-polygon) $P_1$-$P_2$- ... -$P_i$-$P_{i+1}$- ... -$P_m$ that is one of features of the initial layout and the FEM model, dotted lines representing finite elements. Let us first discuss a node $N_1$ which is one of nodes forming a finite element A. First, the vector product of a vector $N_1 P_i$ and a vector $N_1 P_{i+1}$ is obtained, and the sign of a z-component of the vector product is identified. At the same time, an angle $\theta_i$ ($<180°$) defined by the vector $N_1 P_i$ and the vector $N_1 P_{i+1}$ is obtained. This process is carried out for each value of "i" (i=1 to m). Next, Equation (4) shown below is calculated. It is determined that the node $N_1$ is in the closed figure when $|\theta_{total}| > 180°$ and that the node $N_1$ is out of the closed figure when $|\theta_{total}| \leqq 180°$.

$$\theta_{total} = \sum_{i=1}^{m} \varepsilon_i \cdot \theta_i \quad (4)$$

where $\varepsilon_i$ is +1 when the z-component of the vector product is positive and $\varepsilon_i$ is −1 when the z-component of the vector product is negative.

Such a relationship is similarly checked at nodes $N_2$, $N_3$, and $N_4$, and it is determined that the element belongs to the closed figure only when all of the nodes forming the single element are located inside the closed figure.

Figure 9A:
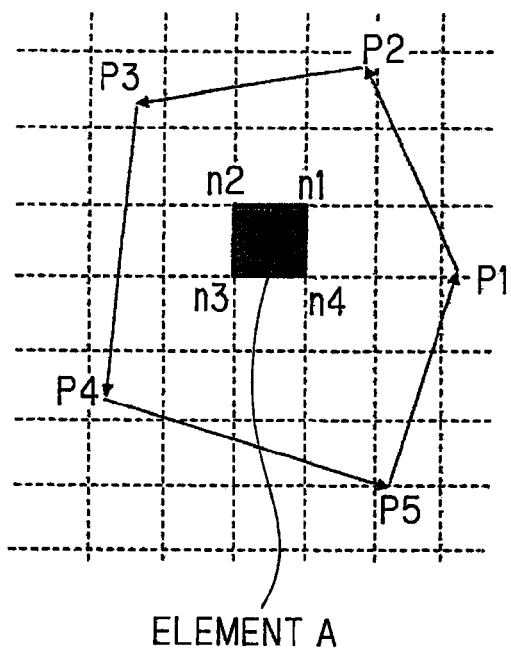
FIG. 9A is a diagram showing an example in which a finite element belongs to a closed figure in a mapping process.
Figure 9B:
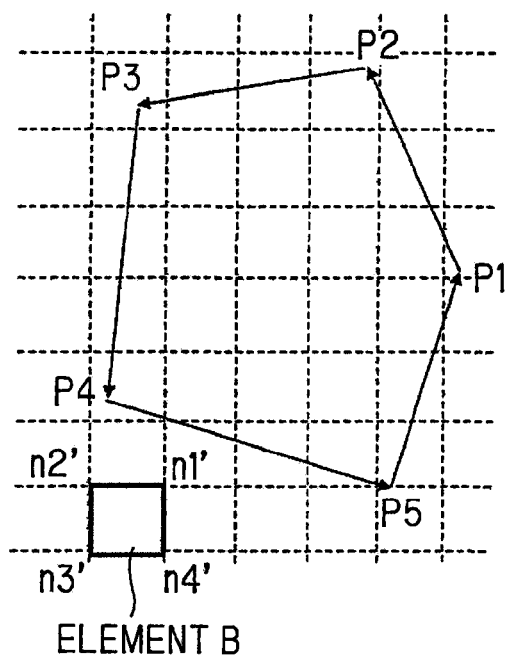
FIG. 9B is a diagram showing an example in which a finite element does not belong to a closed figure in the same process.

A mapping process as described below may be carried out for a polygonal closed figure as shown in FIG. 9A. FIG. 9A shows a polygon P1-P2-P3-P4-P5 as a closed figure which is one of features of the initial layout. For example, let us discuss a node n1 forming a finite element A. The vector product of a vector P1P2 representing one edge forming the polygon and a normal vector extending through the node n1 and normal to the vector P1P2 is obtained. Then, the positional relationship between the node n1 and the vector P1P2 can be identified from the sign of a third component (z-component) of the vector product. Such a relationship is checked between the node n1 and all of vectors forming edges of the polygon. A similar check is made at nodes n2, n3, and n4 to determine whether all of the nodes forming the single element are located inside the closed figure or not. FIG. 9B shows an example of a finite element B which does not belong to a closed figure.

Relationships between all finite elements in one pitch unit of the tread pattern and features in the initial layout are identified as thus described to create an FEM model of the tread pattern constituting one pitch unit. The unit is disposed in a predetermined number of pitches in the circumferential direction to create a tire FEM model having an initial layout with the tread pattern specified as described above (step S46). Thereafter, step S14 and steps subsequent thereto are performed in the same way as in the first embodiment to optimize the tire tread pattern.

According to the present embodiment, even when there are limitations on the design of a tire tread pattern, an analytical model for the pattern can be automatically generated in a design which is needed to be defined as an initial layout. Therefore, a tread pattern can be designed efficiently even when there are limitations on designing.

EXAMPLES

A description will now be made on examples of optimization of a tire tread pattern using the numerical optimizations according the above-described embodiments.

The examples are based on an assumption of a tire size 225/45R17, and a structural analysis was carried out at an air pressure of 220 kPa and a load of 5782N using a rim type 17×7.5JJ. Referring to friction with road surfaces, there was slippery conditions. Dispersion of a ground contact pressure of the tires was used as an objective function, and an optimization problem for minimizing the ground contact pressure dispersion was defined. Dispersion of a ground contact pressure at each element was used as an evaluation index.

Figure 10A:
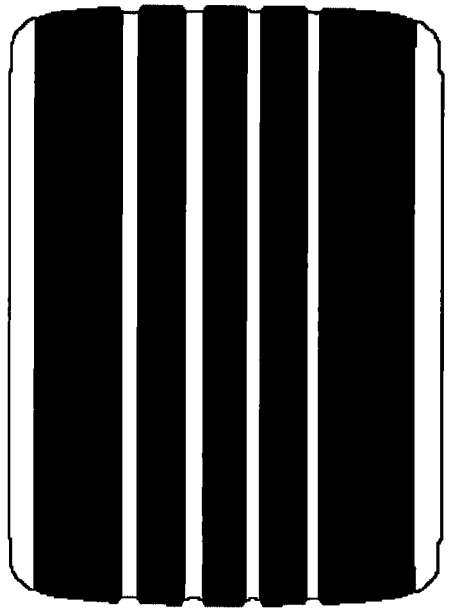
FIG. 10A is an illustration of an initial layout of example 1.
Figure 10B:
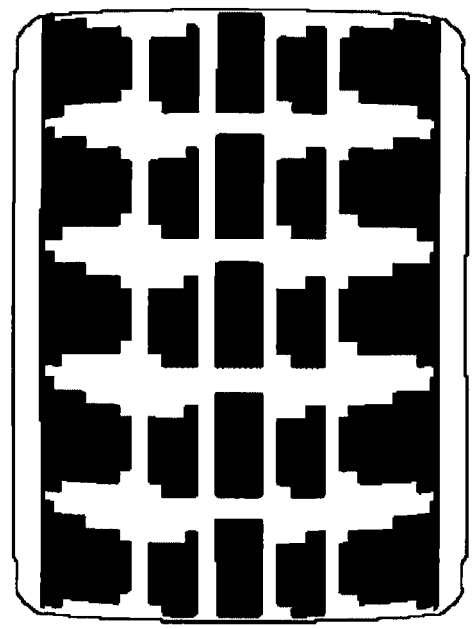
FIG. 10B is an illustration of a final layout obtained through optimization in example 1.
Figure 11A:
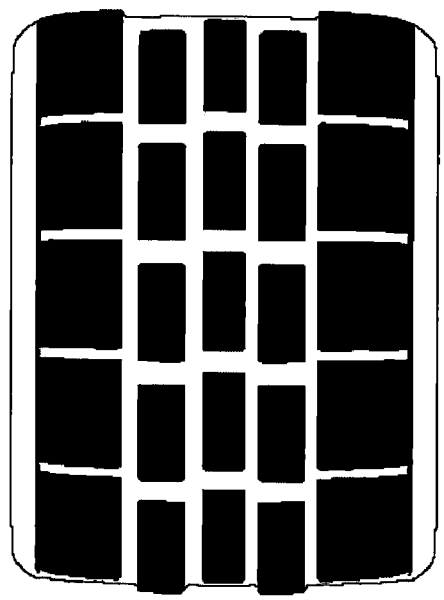
FIG. 11A is an illustration of an initial layout of example 2.

Example 1 corresponds to the first embodiment, and tread pattern optimization was carried out from a tread pattern having main grooves only as an initial value. An initial layout as shown in FIG. 11A was used (FIG. 11A shows a grounding shape of the tire having five pitches of the layout extending in the circumferential direction), and a structural analysis was carried out by developing the layout into five pitches in the circumferential direction. Elements were categorized into 20 classes, and a removal factor β=0.8 and an α-cut value α=0.95 were used. A void ratio upper limit of 0.35 was set. A finial layout as shown in FIG. 10B was obtained through optimization (FIG. 10B shows a grounding shape of the tire having five pitches of extending in the circumferential direction).

Figure 11B:
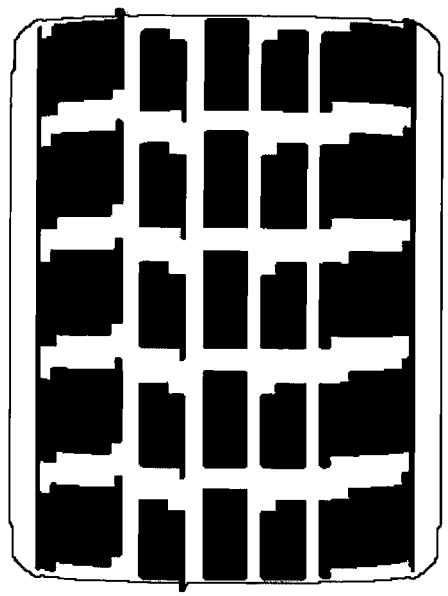
FIG. 11B is an illustration of an optimized layout of example 2.

Example 2 corresponds to the second embodiment, and tread pattern optimization was carried out from a tread pattern specified as an initial value. An initial layout as shown in FIG. 11A was used (FIG. 11A shows a grounding shape of the tire having five pitches of the layout extending in the circumferential direction), and a structural analysis was carried out by developing the layout into five pitches in the circumferential direction. Elements were categorized into 20 classes, and a removal factor β=0.8 and an α-cut value α=0.95 were used. A void ratio upper limit of 0.35 was set. A finial layout as shown in FIG. 11B was obtained through optimization (FIG. 11B shows a grounding shape of the tire having five pitches of extending in the circumferential direction).

A design method on a trial-and-error basis involving repetition of a cycle of designing, structural analysis, and re-designing according to the related art was carried out as comparative example 1 for comparison with the examples. A design method for obtaining an optimum from a tread pattern having main groves only as an initial value using a genetic algorism was carried out as comparative example 2.

Table 1 shows computational costs required for optimization carried out by examples 1 and 2 and comparative examples 1 and 2. Table 1 also shows the effect of improving an objective function (ground contact pressure distribution) achieved by the examples on a conventional product tire as a controlled tire.

Referring to the effect of improving the objective function, analytical values of the objective function obtained by structural analysis and actual measured values of the function obtained by fabricating tires in practice are shown in the form of index numbers relative to an analytical value and an actual measured value, each of which is assumed to be 100, of ground contact pressure distribution of the conventional product tire. The computational costs are shown in the form of index numbers relative to the time required for calculations in comparative example 1 which is assumed to be 100. A numerical value on the table represents the shorter calculation time and means that the more significant advantage is achieved in computational cost, the smaller the numerical value is.

TABLE 1

|  |  | Conventional Product | Comparative Example 1 | Comparative Example 2 | Example 1 | Example 2 |
|---|---|---|---|---|---|---|
| Initial Value | | — | — | Pattern with Main Groove | Pattern with Main Groove | Specified Pattern |
| Objective Function (ground contact pressure distribution) | Analytical Value | 100 | 96 | 94 | 93 | 93 |
| | Measured Value | 100 | 97 | 96 | 95 | 95 |
| Computation Cost | | — | 100 | 125 | 75 | 75 |

As shown in Table 1, ground contact pressure distribution was significantly improved in the examples of the invention compared to that in the conventional product tire, and the examples had a calculation time shorter than that of comparative examples 1 and 2.

The invention is advantageous when applied to designing of tread patterns of various types of tires such as pneumatic radial tires.

What is claimed is:

1. A computer-implemented tire design method comprising the steps of:
    (a) deciding an initial layout of a first pitch unit of a tire tread pattern;
    (b) creating a first finite element model of a tire by developing the first pitch unit of the initial layout into a first plurality of pitches in a circumferential direction of the tire;
    (c) calculating a respective first evaluation index for each element of a ground contact surface in the first finite element model through a structural analysis using the first finite element model of the initial layout;
    (d) integrating calculated evaluation indices into a tentative pitch unit tantamount to any one among the first plurality of pitches for each element of the tentative pitch unit, where an integrated evaluation index for each element of the tentative pitch unit is expressed by a function $$A(i, j) = \sum_{k=1}^{N} F(i, j, k)/N \text{ or } A(i, j) = \sum_{k=1}^{N} F(i, j, k),$$

$F(i, j, k)$ being an evaluation index function for each pitch element, $(i, j)$ representing pitch element indices, k representing a pitch number, and N representing the number of pitches, classifying elements of the tentative pitch unit according to magnitudes of the integrated evaluation indices, respectively, to determine a plurality of classes to which elements of the tentative pitch unit subject to removal belong, and selecting elements of the tentative pitch unit to be removed from each of classes thus determined;
    (e) selecting elements to be added as restored from among the elements of the tentative pitch unit which have been removed;
    (f) obtaining a current generation layout through the removal and addition of elements at the steps (d) and (e) to obtain a second pitch unit and to create a second finite element model of the tire by developing the second pitch unit of the current generation layout into a second plurality of pitches in the circumferential direction of the tire;
    (g) calculating a respective second evaluation index for each element of a ground contact surface of the second finite element model through a structural analysis using the second finite element model of the current generation layout;
    (h) determining convergence of an objective function from the calculated second evaluation indices, updating the initial layout to the current generation layout and returning to the step (d) when it is determined that convergence has not occurred, and deciding the tire tread pattern using the current generation layout as an optimum layout when it is determined that convergence has occurred; and
    (i) producing a tire design having the tread pattern decided using the optimum layout.

2. The tire design method according to claim 1, wherein the step (e) determines elements to be added based on a constraint condition on a void ratio of the tread pattern among the elements which have been removed.

3. The tire design method according to claim 1, wherein the step (d) selects elements to be removed from the classes subject to removal using fuzzy partitioning.

4. The tire design method according to claim 1, wherein the tire tread pattern in the initial layout has only a circumferential groove.

5. The tire design method according to claim 1, wherein the tire tread pattern in the initial layout has a circumferential groove and a lateral groove and/or a block and wherein the step (b) creates the first finite element model of a tire having the tire tread pattern in the initial layout from a finite element model of a tire having only a circumferential groove on a tread thereof using a mapping algorithm.

6. A tire manufacturing method comprising:
    (a) deciding an initial layout of a first pitch unit of a tire tread pattern;

(b) creating a first finite element model of a tire by developing the first pitch unit of the initial layout into a first plurality of pitches in a circumferential direction of the tire;

(c) calculating a respective first evaluation index for each element of a ground contact surface in the first finite element model through a structural analysis using the first finite element model of the initial layout;

(d) integrating calculated evaluation indices into a tentative pitch unit tantamount to any one among the first plurality of pitches for each element of the tentative pitch unit, where an integrated evaluation index for each element of the tentative pitch unit is expressed by a function $$A(i, j) = \sum_{k=1}^{N} F(i, j, k)/N \text{ or } A(i, j) = \sum_{k=1}^{N} F(i, j, k),$$

F(i, j, k) being an evaluation index function for each pitch element, (i, j) representing pitch element indices, k representing a pitch number, and N representing the number of pitches, classifying elements of the tentative pitch unit according to magnitudes of the integrated evaluation indices, respectively, to determine a plurality of classes to which elements of the tentative pitch unit subject to removal belong, and selecting elements of the tentative pitch unit to be removed from each of classes thus determined;

(e) selecting elements to be added as restored from among the elements of the tentative pitch unit which have been removed;

(f) obtaining a current generation layout through the removal and addition of elements at the steps (d) and (e) to obtain a second pitch unit and to create a second finite element model of the tire by developing the second pitch unit of the current generation layout into a second plurality of pitches in the circumferential direction of the tire;

(g) calculating a respective second evaluation index for each element of a ground contact surface of the second finite element model through a structural analysis using the second finite element model of the current generation layout;

(h) determining convergence of an objective function from the calculated second evaluation indices, updating the initial layout to the current generation layout and returning to the step (d) when it is determined that convergence has not occurred, and deciding the tire tread pattern using the current generation layout as an optimum layout when it is determined that convergence has occurred; and producing a tire design having the tread pattern decided using the optimum layout.

(i) manufacturing a tire having the tire tread pattern that used the optimum layout.

7. A computer-readable medium storing a program for designing a tire using a computer, the program for causing the computer to perform operations comprising:

(a) deciding an initial layout of a first pitch unit of a tire tread pattern;

(b) creating a first finite element model of a tire by developing the first pitch unit of the initial layout into a first plurality of pitches in a circumferential direction of the tire;

(c) calculating a respective first evaluation index for each element of a ground contact surface in the first finite element model through a structural analysis using the first finite element model of the initial layout;

(d) integrating calculated evaluation indices into a tentative pitch unit tantamount to any one among the first plurality of pitches for each element of the tentative pitch unit, where an integrated evaluation index for each element of the tentative pitch unit is expressed by a function $$A(i, j) = \sum_{k=1}^{N} F(i, j, k)/N \text{ or } A(i, j) = \sum_{k=1}^{N} F(i, j, k),$$

F(i, j, k) being an evaluation index function for each pitch element, (i, j) representing pitch element indices, k representing a pitch number, and N representing the number of pitches, classifying elements of the tentative pitch unit according to magnitudes of the integrated evaluation indices, respectively, to determine a plurality of classes to which elements of the tentative pitch unit subject to removal belong, and selecting elements of the tentative pitch unit to be removed from each of classes thus determined;

(e) selecting elements to be added as restored from among the elements of the tentative pitch unit which have been removed;

(f) obtaining a current generation layout through the removal and addition of elements at the steps (d) and (e) to obtain a second pitch unit and to create a second finite element model of the tire by developing the second pitch unit of the current generation layout into a second plurality of pitches in the circumferential direction of the tire;

(g) calculating a respective second evaluation index for each element of a ground contact surface of the second finite element model through a structural analysis using the second finite element model of the current generation layout;

(h) determining convergence of an objective function from the calculated second evaluation indices, updating the initial layout to the current generation layout and returning to the step (d) when it is determined that convergence has not occurred, and deciding the tire tread pattern using the current generation layout as an optimum layout when it is determined that convergence has occurred; and (i) producing a tire design having the tread pattern decided using the optimum layout.

* * * * *

UNITED STATES PATENT AND TRADEMARK OFFICE
CERTIFICATE OF CORRECTION

PATENT NO.         : 8,086,428 B2
APPLICATION NO.    : 12/098780
DATED              : December 27, 2011
INVENTOR(S)        : Yoshihiro Tanaka et al.

It is certified that error appears in the above-identified patent and that said Letters Patent is hereby corrected as shown below:

Col 1, line 9, delete "2007" and insert --2008--.

Col 13, Claim 6, line 52, delete "producing a tire design having the tread pattern decided using the optimum layout".

Col 13, Claim 6, line 55, delete "used" and insert --uses--.

Signed and Sealed this
Fourth Day of September, 2012

David J. Kappos
*Director of the United States Patent and Trademark Office*